(12) United States Patent
Finn et al.

(10) Patent No.: US 12,068,691 B2
(45) Date of Patent: Aug. 20, 2024

(54) REGULATOR BOOSTER ACTIVATED BY BOOST SIGNAL TO BOOST VOLTAGE OF REGULATED OUTPUT BY TARGET AMOUNT

(71) Applicant: Renesas Electronics America Inc., Milpitas, CA (US)

(72) Inventors: Steven Ernest Finn, Atlanta, GA (US); Ajinkya Manohar Munge, Johns Creek, GA (US)

(73) Assignee: Renesas Electronics America Inc., Milpitas, CA (US)

( * ) Notice: Subject to any disclaimer, the term of this patent is extended or adjusted under 35 U.S.C. 154(b) by 193 days.

(21) Appl. No.: 17/546,368

(22) Filed: Dec. 9, 2021

(65) Prior Publication Data
US 2023/0188038 A1 Jun. 15, 2023

(51) Int. Cl.
*H02M 3/158* (2006.01)
*G05F 1/575* (2006.01)
*G11C 5/14* (2006.01)

(52) U.S. Cl.
CPC .......... *H02M 3/1582* (2013.01); *G05F 1/575* (2013.01); *G11C 5/14* (2013.01)

(58) Field of Classification Search
CPC ..... G05F 1/00; G05F 1/10; G05F 1/12; G05F 1/46; G05F 1/455; G05F 1/45; G05F 1/445; G05F 1/66; G05F 1/40; G05F 1/42; G05F 1/44; G05F 1/462; G05F 1/52; G05F 1/56; G05F 3/10; G05F 3/16; G05F 3/18; G05F 3/185; G05F 3/20; G05F 3/26; G05F 3/30; G05F 3/205; G05F 3/22; G05F 3/24; G05F 3/222; G05F 3/242; G05F 3/225; G05F 3/227; G05F 3/245; G05F 3/247; G05F 3/262; G05F 3/265; G05F 3/267; G05F 1/575; H02M 5/2573; H02M 1/081; H02M 5/293; H02M 7/12; H02M 3/10; H02M 3/125; H02M 3/13; H02M 3/135; H02M 3/145; H02M 3/15; H02M 3/155;
(Continued)

(56) References Cited

U.S. PATENT DOCUMENTS 5,793,680 A * 8/1998 Okajima ............... G11C 7/1066
365/207
6,388,506 B1 * 5/2002 Voo ....................... H02M 3/073
327/536
(Continued)

FOREIGN PATENT DOCUMENTS

CN 104181967 * 12/2014

*Primary Examiner* — Thienvu V Tran
*Assistant Examiner* — Nusrat Quddus
(74) *Attorney, Agent, or Firm* — SCULLY, SCOTT, MURPHY & PRESSER, P.C.

(57) ABSTRACT

In an embodiment, an apparatus is disclosed that comprises a voltage regulator and a regulator booster. The voltage regulator is supplied by an input and is configured to generate a regulated output. The regulated output has a voltage corresponding to an operating point of the voltage regulator. The regulator booster is connected to the voltage regulator and, when activated, is configured to boost the voltage of the regulated output by a target amount. The target amount is at least a portion of a magnitude of a voltage droop relative to the operating point that is caused by a change in a current load on the regulated output.

17 Claims, 8 Drawing Sheets

(58) Field of Classification Search
CPC .... H02M 3/156; H02M 3/158; H02M 3/1588; H02M 2003/1566; H02M 3/1582; H02M 2003/1557; H02M 3/1584; H02M 3/285; H02M 3/33561; H02M 7/49; H02M 1/045; H02M 7/006; H02M 7/06; H02M 7/068; H02M 7/153; H02M 7/10; H02M 1/088; H02M 7/103; H02M 7/106; H02M 7/19; H02M 7/08; H02M 7/17; H02M 2001/007; H02M 7/493; H02M 7/53806; H02M 7/5381; H02M 7/483; H02M 7/217; H02M 7/538466; H02M 7/5387; H02M 7/53871; H02M 7/53873; H02M 7/53875; H02M 1/084; H02M 1/0845; H05B 39/048; B23K 11/24; H04B 2215/069; H02J 3/46; H02J 3/38
See application file for complete search history.

(56) References Cited

U.S. PATENT DOCUMENTS

| | | | | |
|---|---|---|---|---|
| 6,937,487 B1 * | 8/2005 | Bron | ................... | H02M 3/073 363/60 |
| 7,068,024 B1 * | 6/2006 | Huang | ................... | G05F 3/262 323/907 |
| 10,298,114 B1 * | 5/2019 | Yazdi | ................... | H02M 1/15 |
| 10,680,515 B2 * | 6/2020 | Giuliano | ................. | H02M 3/07 |
| 2001/0017797 A1 * | 8/2001 | Zammattio | ........... | G11C 16/30 365/200 |
| 2004/0017247 A1 * | 1/2004 | Yasui | ................... | H02M 3/073 327/536 |
| 2006/0147062 A1 * | 7/2006 | Niwa | .................... | H03F 3/181 330/297 |
| 2011/0235457 A1 * | 9/2011 | Hirata | ................... | G11C 5/147 365/226 |
| 2012/0268096 A1 * | 10/2012 | Kawasoe | ............. | G09G 3/3696 323/288 |
| 2013/0162175 A1 * | 6/2013 | Kim | ..................... | G09G 3/3225 315/307 |
| 2015/0311707 A1 * | 10/2015 | Ikenaga | ................ | H02J 50/001 307/71 |
| 2016/0189779 A1 * | 6/2016 | Guo | ....................... | G11C 16/06 365/185.19 |
| 2020/0313622 A1 * | 10/2020 | Eichler | .................. | H03F 3/195 |

* cited by examiner

REGULATOR BOOSTER ACTIVATED BY BOOST SIGNAL TO BOOST VOLTAGE OF REGULATED OUTPUT BY TARGET AMOUNT

BACKGROUND OF THE SPECIFICATION

The present disclosure relates to memory. More specifically, the present disclosure relates in some embodiments to voltage regulation in a double data-rate (DDR) random access memory (RAM) module.

Voltage regulators are used to convert input supply voltages into regulated output voltages for use by various components of a memory module. Often a large increase in a current load on the output of a voltage regulator may result in voltage droop, e.g., a temporary decrease in the output voltage of the voltage regulator relative to a target voltage. For example, as a response to a large increase in current load, the voltage output typically decreases temporarily as the voltage regulator drives the current load before stabilizing at the target voltage. Similarly, as a response to a large decrease in the current load, the voltage output typically increases temporarily before stabilizing at the target voltage.

The voltage droop may result in a delay or lag in the supply of the voltage output at the target voltage. Maintaining a steady output voltage may be especially difficult in circumstances where large changes in the current load occur rapidly and repetitively. For example, a memory module operating in a burst mode may rapidly and repetitively wake up and sleep various components of the memory module as needed to service read and write transactions. In such an example, the voltage regulator may experience large swings in current load as the corresponding components wake up or sleep which may result in voltage droop and delays or lag in the supply of the voltage output at the target voltage.

SUMMARY

In an embodiment, an apparatus is disclosed that comprises a voltage regulator and a regulator booster. The voltage regulator is supplied by an input and is configured to generate a regulated output. The regulated output has a voltage corresponding to an operating point of the voltage regulator. The regulator booster is connected to the voltage regulator and, when activated, is configured to boost the voltage of the regulated output by a target amount. The target amount is at least a portion of a magnitude of a voltage droop relative to the operating point that is caused by a change in a current load on the regulated output.

In another embodiment, a memory module is disclosed that comprises a data buffer. The data buffer comprises a voltage regulator and a regulator booster. The voltage regulator is supplied by an input and is configured to generate a regulated output. The regulated output has a voltage corresponding to an operating point of the voltage regulator. The regulator booster is connected to the voltage regulator and, when activated, is configured to boost the voltage of the regulated output by a target amount. The target amount is at least a portion of a magnitude of a voltage droop relative to the operating point that is caused by a change in a current load on the regulated output.

In another embodiment, an apparatus is disclosed that comprises a regulator booster that, when activated, is configured to boost a voltage of regulated output by a target amount. The target amount is at least a portion of a magnitude of a voltage droop relative to an operating point of the regulated output that is caused by a change in a current load on the regulated output.

The foregoing summary is illustrative only and is not intended to be in any way limiting. In addition to the illustrative aspects, embodiments, and features described above, further aspects, embodiments, and features will become apparent by reference to the drawings and the following detailed description. In the drawings, like reference numbers indicate identical or functionally similar elements.

DETAILED DESCRIPTION

Power management in DDR random access memory (RAM) modules often relies on the use of a power management integrated circuit (PMIC) to handle the conversion of a bulk power input to one or more power outputs having voltages that correspond to the requirements for different components of the DDR memory module, and in some embodiments, a DDR fifth generation (DDR5) memory module. In one example, the disclosed embodiments may comprise unbuffered dual inline memory modules (UDIMM). For example, for a notebook computer, the disclosed embodiments may comprise small outline dual in-line memory modules (SODIMM) such as, e.g., DDR5 SODIMM. In another example, the disclosed embodiments may comprise registered dual inline memory modules (RDIMM). The disclosed embodiments may alternatively comprise any type of memory module.

Figure 1:
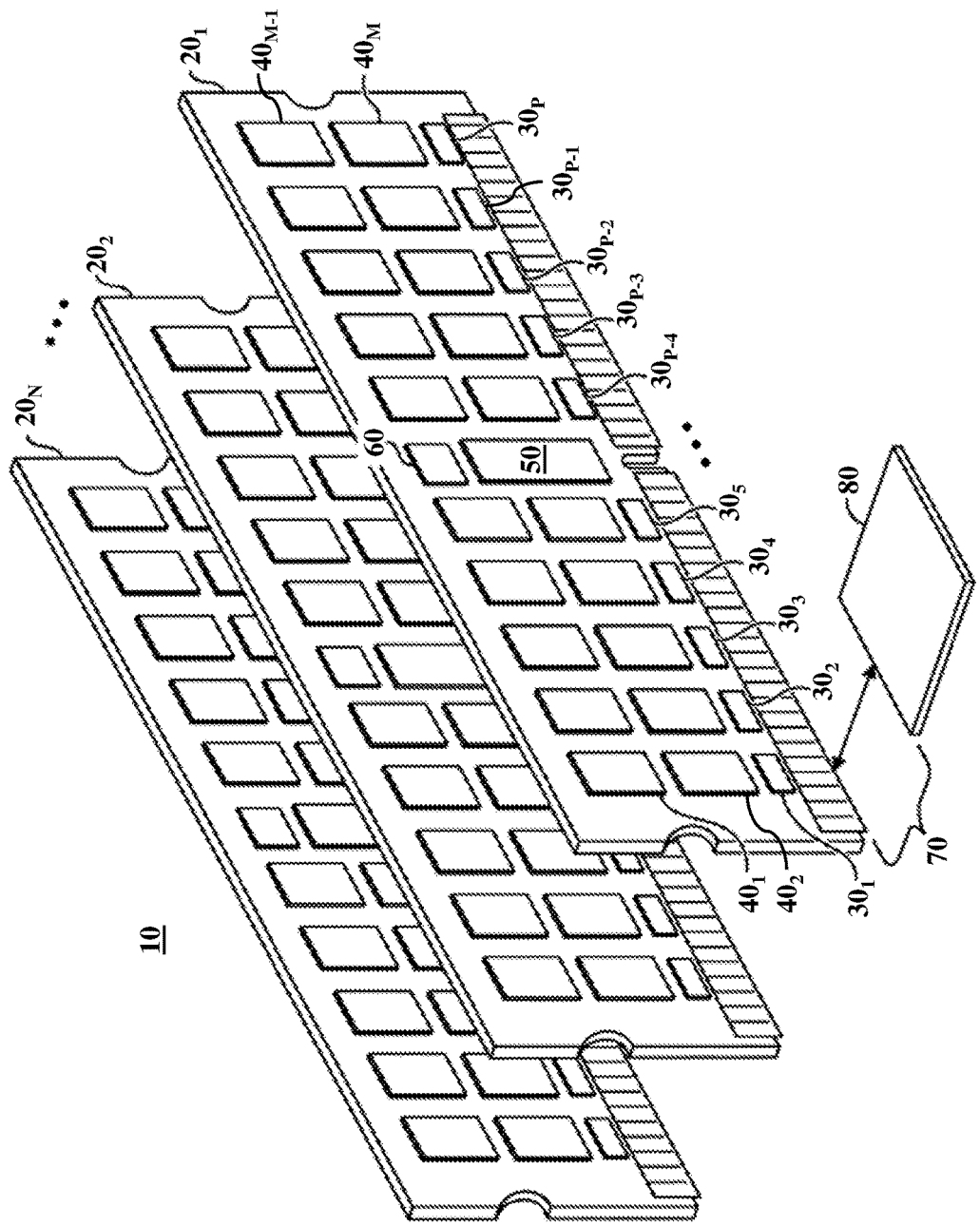
FIG. 1 is a diagram of an example memory system according to an embodiment.
Figure 2:
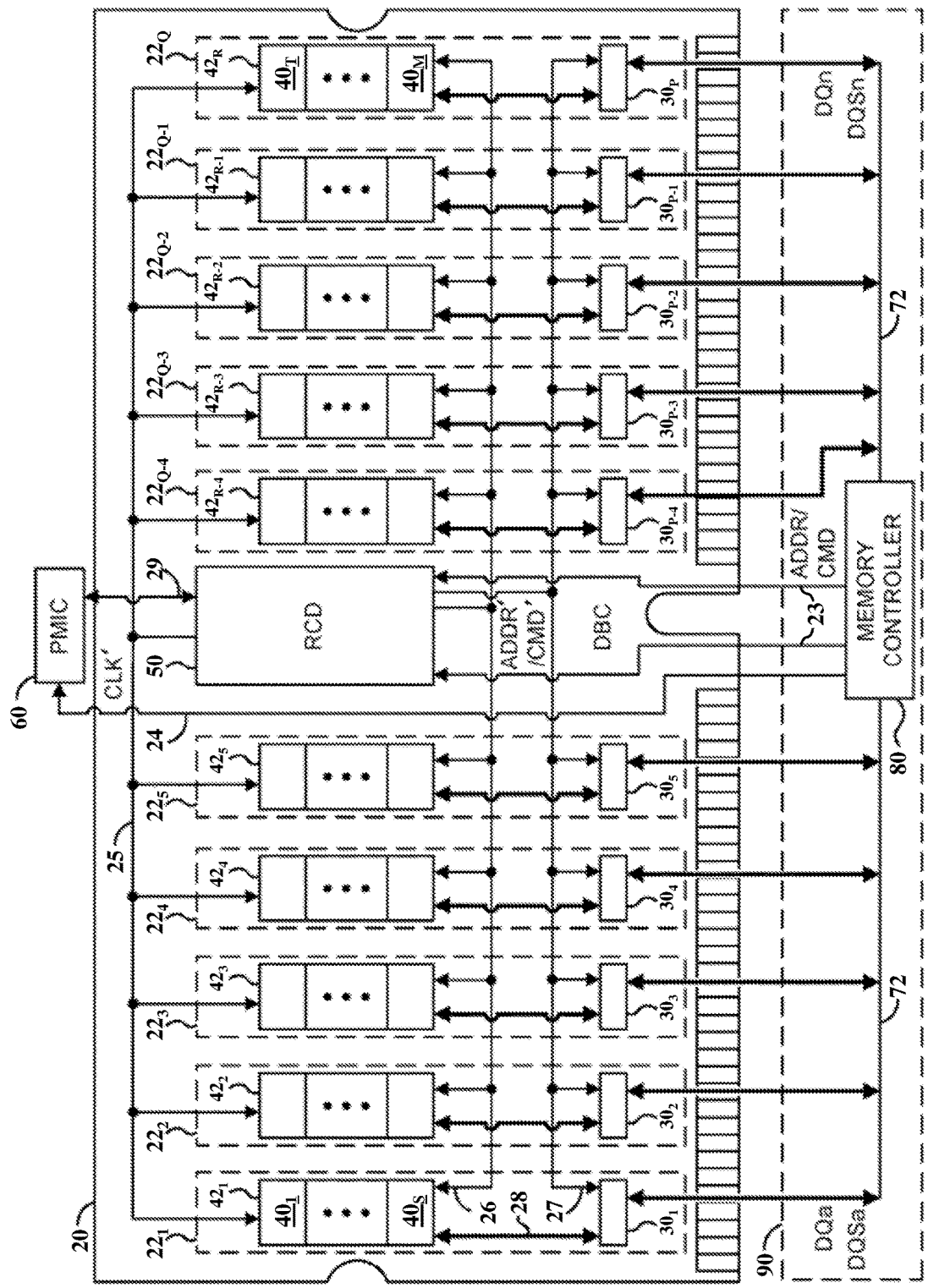
FIG. 2 is a block diagram illustrating an example memory module of the memory system of FIG. 1 according to an embodiment.

FIGS. 1 and 2 illustrate an example embodiment of a memory system 10. The memory system 10 includes memory modules $20_1$, $20_2$ ... $20_N$, also referred to herein collectively or individually as memory module(s) 20, connectors 70 and a memory controller 80.

With reference to FIG. 1, in one example embodiment, memory modules 20 may comprise dual in-line memory modules (DIMMs). In some embodiments, memory modules 20 may be implemented as double data rate fifth generation (DDR5) SDRAM modules. While described and illustrated herein as having a particular type, arrangement and number of components, in other embodiments, memory modules 20 may comprise any other type, arrangement or number of components.

An example memory module 20 comprises circuitry blocks $30_1$, $30_2$, $30_3$, $30_4$, $30_5$ ... $30_{P-4}$, $30_{P-3}$, $30_{P-2}$, $30_{P-1}$ and $30_P$, circuitry blocks $40_1$, $40_2$, ... $40_{M-1}$ and $40_M$, a registered clock driver (RCD) 50, a PMIC 60, connectors 70 and any other blocks, circuits, pins, connectors, traces or other component typically found in a memory module. In some embodiments, circuitry blocks $30_1$, $30_2$, $30_3$, $30_4$, $30_5$ ... $30_{P-4}$, $30_{P-3}$, $30_{P-2}$, $30_{P-1}$ and $30_P$ may be configured as data buffers and will also be referred to herein collectively or individually as data buffers(s) 30. In some embodiments, circuitry blocks $40_1$, $40_2$, ... $40_{M-1}$ and $40_M$ may be configured as memory devices and will also be referred to herein collectively or individually as memory device(s) 40. While described herein as data buffers 30 and memory devices 40, circuitry blocks 30 and 40 may also or alternatively be utilized for any other purpose by memory modules 20.

In some embodiments, data buffers 30 and memory devices 40 comprise synchronous dynamic random-access memory (SDRAM) devices, chips or modules. In some embodiments, data buffers 30 and memory devices 40 also or alternatively comprise any other types of memory devices such as, e.g., SRAM, DRAM, MROM, PROM, EPROM and EEPROM. Data buffers 30, memory devices 40 or both may be physically located on one side or both sides (e.g., the front and back) of memory module 20.

PMIC 60 is configured to perform power management for memory module 20. For example, PMIC 60 may be configured to scale up or scale down voltages, perform DC-DC conversions or perform other similar power management operations. In some embodiments, PMIC 60 may comprise low-dropout regulators (LDOs), DC-DC converters such as, e.g., buck or boost converters, pulse-frequency modulation (PFM), pulse-width modulation (PWM), power field-effect transistors (FETs), real-time clocks (RTCs) or any other circuitry that may typically be found in a PMIC.

Connectors 70 may comprise, for example, pins, traces or other connections that are configured to connect memory modules 20 to other components of a computing system such as, e.g., a memory controller 80, motherboard, or other components. In some embodiments, connectors 70 may comprise, e.g., a 288-pin configuration or any other pin configuration.

In some embodiments, memory module 20 comprises connectors 70. In other embodiments, a motherboard, memory controller 80 or any other component of a computing device comprises connectors 70. In another embodiment, one or more of connectors 70 may be part of memory module 20 and one or more of connectors 70 may be part of the motherboard, memory controller 80 or other component of the computing device.

Memory modules 20 may be connected to the motherboard, memory controller 80 or other component of the computing device, e.g., by connectors 70, to transfer data between components of the computing device and memory modules 20. For example, in an embodiment that implements a UDIMM, connectors 70 may comprise a 64-bit bus, a 72-bit bus or a bus comprising any other number of bits.

Memory modules 20 are shown connected to memory controller 80 of the computing device. In an example embodiment, memory controller 80 may be implemented as a component of a computer motherboard, or main board, of the computing device, e.g., on a northbridge of the motherboard. In another example, memory controller 80 may be implemented as a component of a microprocessor of the computing device. In yet another example, memory controller 80 may be implemented as a component of a central processing unit (CPU) of the computing device. In other embodiments, memory controller 80 may be implemented as a part of any other component of the computing device.

In some embodiments, memory modules 20 are implemented as DDR5 SDRAM memory modules. As an example, memory modules 20 may comprise a memory module density of 128 gigabyte (GB), 512 GB, one terabyte (TB), or higher per module. Memory modules 20 may operate with a frequency of about 1.2 to about 3.2 giga-Hertz (GHz) and a data rate range of about 3.2 GT/s to about 4.6 GT/s and in some cases a data rate up to about 8 GT/s or more. In some embodiments, memory modules 20 may alternatively comprise smaller or larger densities, operate at lower or higher frequencies and operate at lower or higher data rates.

With reference now to FIG. 2, a block diagram illustrating an example memory module 20 of FIG. 1 is shown. Memory module 20 may be representative of memory modules 20A-20N. Memory module 20 is shown communicating with memory controller 80. Memory controller 80 is shown as part of a circuit 90 such as, e.g., a motherboard, main board or other component of a computing device that communicates with memory module 20.

Memory module 20 comprises one or more groupings of circuits $22_1$, $22_2$, $22_3$, $22_4$, $22_5$ ... $22_{Q-4}$, $22_{Q-3}$, $22_{Q-2}$, $22_{Q-1}$ and $22_Q$, also referred to herein collectively or individually as data paths 22 of memory module 20. In the example shown, memory module 20 may comprise five data paths 22, e.g., data paths $22_1$, $22_2$, $22_3$, $22_4$ and $22_5$, on one side of RCD 50 and five data paths 22, e.g., data paths $22_{Q-4}$, $22_{Q-3}$, $22_{Q-2}$, $22_{Q-1}$ and $22_Q$, on the other side of RCD 50. In other embodiments, memory module 20 may comprise other arrangements having a greater or smaller number of data paths 22 on each side of RCD 50.

Data paths 22 may each comprise a respective memory channel $42_1$, $42_2$, $42_3$, $42_4$, $42_5$ ... $42_{R-4}$, $42_{R-3}$, $42_{R-2}$, $42_{R-1}$ and $42_R$, also referred to herein collectively and individually as memory channel(s) 42. Each memory channel 42 may comprise one or more of memory devices 40. For example, memory channel $42_1$ may comprise memory devices $40_1$ through $40_S$, while memory channel $42_R$ may comprise memory devices $40_T$ through $40_M$.

Memory controller 80 is configured to generate a variety of signals including a clock signal (CLK), control signals (ADDR and CMD) and command signals. One or more of the CLK, ADDR and CMD signals may be provided to RCD 50, e.g., via one or more buses 23.

Signals from memory controller 80 may also be transmitted from memory controller 80 to PMIC 60 via a bus 24, also referred to herein as a host interface bus 24. In some embodiments, host interface bus 24 is bi-directional and is configured to communicate commands or other data between PMIC 60 and memory controller 80 or other components of memory module 20. Host interface bus 24 may implement an $I^2C$ protocol, an $I^3C$ protocol or any other protocol.

A data bus 72 may be connected between memory controller 80 and data paths 22, e.g., with data buffers 30, and may comprise connectors 70, e.g., traces, pins and other connections, between memory controller 80 and data paths 22.

Memory controller 80 may generate or receive data signals, e.g., DQa-DQn, and data strobe signals, e.g., DQSa- DQSn, that may be presented to or received from data bus 72. Portions of the signals DQa-DQn and DQSa-DQSn may be presented to or received from respective data paths 22. In the example shown, each of the signals DQa-DQn may have a corresponding signal DQSa-DQSn. In some embodiments, one DQS signal may strobe multiple DQ signals, e.g., one DQS signal for four DQ signals in some embodiments.

RCD 50 is configured to communicate with memory controller 80, data buffers 30, memory channels 42 and PMIC 60. RCD 50 is configured to decode instructions, e.g., control words, received from memory controller 80. For example, RCD 50 may be configured to receive and decode register command words (RCWs). In another example, RCD 50 may be configured to receive and decode buffer control words (BCWs). RCD 50 is configured to train one or more of data buffers 30, memory devices 40 and the command and address lines between RCD 50 and memory controller 80. For example, the RCWs may flow from memory controller 80 to RCD 50 and be used to configure RCD 50.

In some embodiments, RCD 50 may implement a command/address register, e.g., a 32-bit 1:2 command/address register. RCD 50 may support an at-speed bus, e.g., a unidirectional buffer communications (BCOM) bus between RCD 50 and data buffers 30. In some embodiments, RCD 50 may implement one or more of automatic impedance calibration, command/address parity checking, control register RCW readback, a serial bus such as, e.g., a 1 MHz inter-integrated circuit ($I^2C$) bus, and a 12.5 MHz inter-integrated circuit ($I^3C$) bus. Inputs to RCD 50 may be pseudo-differential using one or more of external and internal voltages. The clock outputs, command/address outputs, control outputs and data buffer control outputs of RCD 50 may be enabled in groups and independently driven with different strengths.

RCD 50 is configured to receive the CLK, ADDR and CMD signals or other signals such as, e.g., RCWs and BCWs, from memory controller 80 and to utilize various digital logic components to generate corresponding output signals based on the CLK, ADDR and CMD signals. For example, RCD 50 is configured to generate corresponding signals such as, e.g., CLK', ADDR' and CMD' signals based on the received CLK, ADDR and CMD signals. The CLK', ADDR' and CMD' signals may be presented to memory channels 42. For example, the CLK' signals may be transmitted from RCD 50 to memory channels 42 on a common bus 25 and the ADDR' and CMD' signals may be transmitted from RCD 50 to memory channels 42 on a common bus 26. RCD 50 is also configured to generate one or more data buffer control (DBC) signals that are transmitted to data buffers 30, for example, on a common bus 27, also referred to herein as a data buffer control bus 27.

Data buffers 30 are configured to receive commands and data from data buffer control bus 27 and to generate data, receive data or transmit data to and from data bus 72. Each data path 22 also comprises a bus 28 between its data buffer 30 and memory channel 42 that is configured to carry the data between its data buffer 30 and memory channel 42. For example, as seen in FIG. 2, data path $22_1$ comprises a bus 28 between data buffer $30_1$ and memory channel $42_1$.

Data buffers 30 are configured to buffer data on buses 72 and 28 for write operations, e.g., data transfers from memory controller 80 to the corresponding memory channels 42, and read operations, e.g., data transfers from the corresponding memory channels 42 to memory controller 80.

In some example embodiments, data buffers 30 exchange data with memory devices 40 via the corresponding buses 28 in small units, e.g., 4-bit nibbles. In other embodiments, larger or smaller sizes of data transfer may alternatively be utilized. In some cases, memory devices 40 may be arranged into multiple sets, e.g., two sets. For example, for a two set/two memory device implementation, e.g., memory devices $40_1$ and $40_2$, each set may contain a single memory device 40, e.g., $40_1$ or $40_2$) with each memory device 40 being connected to the respective data buffers 30 through an upper nibble and a lower nibble. For two set/four memory device implementation, each set may contain two memory devices 40. The first set may be connected to the respective data buffers 30 through the upper nibble and the second set may be connected to the respective data buffers 30 through the lower nibble. For two set/eight memory device implementation, each set may contain four of memory devices 40. The first set of four memory devices 40 may connect to the respective data buffers 30 through the upper nibble and the second set of four memory devices may connect to the respective data buffers 30 through the lower nibble. Other numbers of sets, other numbers of memory devices per set and other data unit sizes may alternatively be utilized.

Memory module 20 may also comprise an interface 29 that is configured to enable communication between RCD 50 and PMIC 60. For example, interface 29 may utilized as part of a register clock driver/power management integrated circuit interface, e.g., an RCD-PMIC interface. Interface 29 is configured to support one or more signals or connections that may be bidirectional or unidirectional.

Power management in a DDR memory module is performed by a highly integrated, highly efficient PMIC 60 with programmable and precise output voltage power solutions. In some embodiments, PMIC 60 is powered from two input power supplies, e.g., a management power supply $VIN_{MGMT}$ and a bulk power supply $VIN_{BULK}$ although other power supplies may also be present. In some embodiments, PMIC 60 may comprise a plurality of pins, e.g., 36 pins or another number of pins, that connect to memory module 20 where $VIN_{MGMT}$ and $VIN_{BULK}$ each receive power from one or more of the pins. For example, $VIN_{BULK}$ may receive power from memory module 20 via four pins and $VIN_{MGMT}$ may receive power from memory module 20 via one pin. In other embodiments, a different number of pins may supply power to $VIN_{MGMT}$ and $VIN_{BULK}$. One or more of the pins may correspond to one or more of connectors 70 where, for example, the power supplied to PMIC 60 for one or both of $VIN_{MGMT}$ and $VIN_{BULK}$ may be received from circuit 90 of the computing device such as, e.g., a motherboard, main board or other component of the computing device that communicates with memory module 20.

In some embodiments, PMIC 60 receives a $VIN_{MGMT}$ having a voltage of about 3.3V and receives a $VIN_{BULK}$ having a voltage range of about 4.25V to about 15V from memory module 20. For example, the voltage of $VIN_{BULK}$ may vary based on the required load for PMIC 60 at any given time. Other voltage values or ranges for $VIN_{MGMT}$ and $VIN_{BULK}$ may alternatively be used.

PMIC 60 comprises a plurality of voltage regulation modules (VRMs) 102 through 116. VRMs 102 through 116 are configured to provide regulated output voltages for the various components of memory module 20. PMIC 60 is configured to manage, maintain and adjust the output voltages where, for example, PMIC 60 may perform adjustments or modifications to the output voltages based on instructions received from RCD 50 or memory controller 80.

Figure 3:
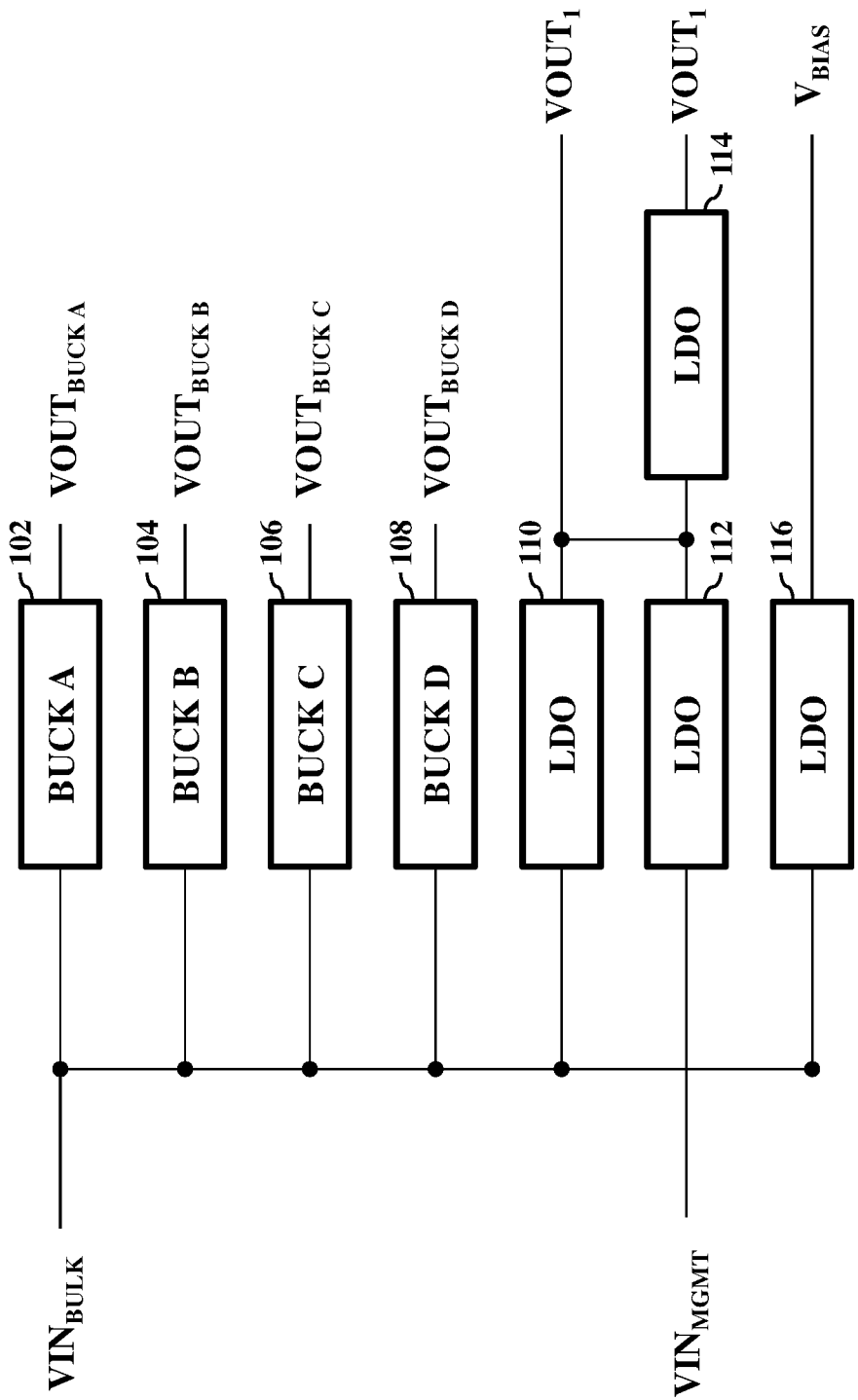
FIG. 3 is a block diagram of an example power management integrated circuit (PMIC) of the memory module of FIG. 2 according to an embodiment.

As illustrated in FIG. 3, for example, VRMs 102 through 108 comprise DC-DC converters such as, e.g., buck converters, which are utilized to step down the voltage of $VIN_{BULK}$ to corresponding output voltages $VOUT_{BUCK\ A}$, VOUT$_{BUCK\_B}$, VOUT$_{BUCK\_C}$ and VOUT$_{BUCK\_D}$. For example, VRM 102 may output a stepped down output voltage VOUT$_{BUCK\_A}$ of about 1.0V, sometimes referred to as a V$_{DD}$ supply rail, VRM 104 may output a stepped down output voltage VOUT$_{BUCK\_B}$ of about 1.0V, also sometimes referred to as a V$_{DD}$ supply rail, VRM 106 may output a stepped down output voltage VOUT$_{BUCK\_C}$ of about 1.1V, sometimes referred to as a V$_{DDQ}$ supply rail, and VRM 108 may output a stepped down output voltage VOUT$_{BUCK\_D}$ of about 1.8V, sometimes referred to as a V$_{PP}$ supply rail. VRMs 102 through 108 may also be referred to herein as bucks A through D. While described and illustrated as buck converters, VRMs 102 through 108 may alternatively comprise other types of VRMs. In addition, while described above as outputting particular voltage values, VRMs 102 through 108 may alternatively be configured to output other voltage values, for example, as required by the various components of memory module 20.

VRMs 110 through 116 comprise LDOs that are configured to convert the voltages of VIN$_{BULK}$ and VIN$_{MGMT}$ into continuously controlled, steady, low-noise DC output voltages. For example, VRM 110 is configured to convert VIN$_{BULK}$ into an output voltage VOUT$_1$ of about 1.8V, VRM 112 is configured to convert VIN$_{MGMT}$ into the output voltage VOUT$_1$, VRM 114 is downstream of VRMs 110 and 112 and is configured to convert VOUT$_1$ into an output voltage VOUT$_2$ of about 1.0V and VRM 116 is configured to convert VIN$_{BULK}$ into an output voltage VBIAS of about 5.0V. As seen in FIG. 3, VRMs 110 and 112 work together to maintain or output the voltage VOUT$_1$.

While VRMs 102 through 116 are described above as comprising components such as, e.g., buck converters and LDOs, in other embodiments alternative circuitry may be utilized to perform the voltage regulation functions. Similarly, while VRMs 102 through 116 are described above as outputting particular voltages, in other embodiments alternative voltages may be output depending on the requirements of memory module 20. In some embodiments other components of memory module 20 may also or alternatively comprise VRMs such as those described above. For example, in some embodiments one or more of data buffers 30 may comprise VRMs.

Illustrative embodiments will now be described with reference to FIGS. 4-8.

Figure 4:
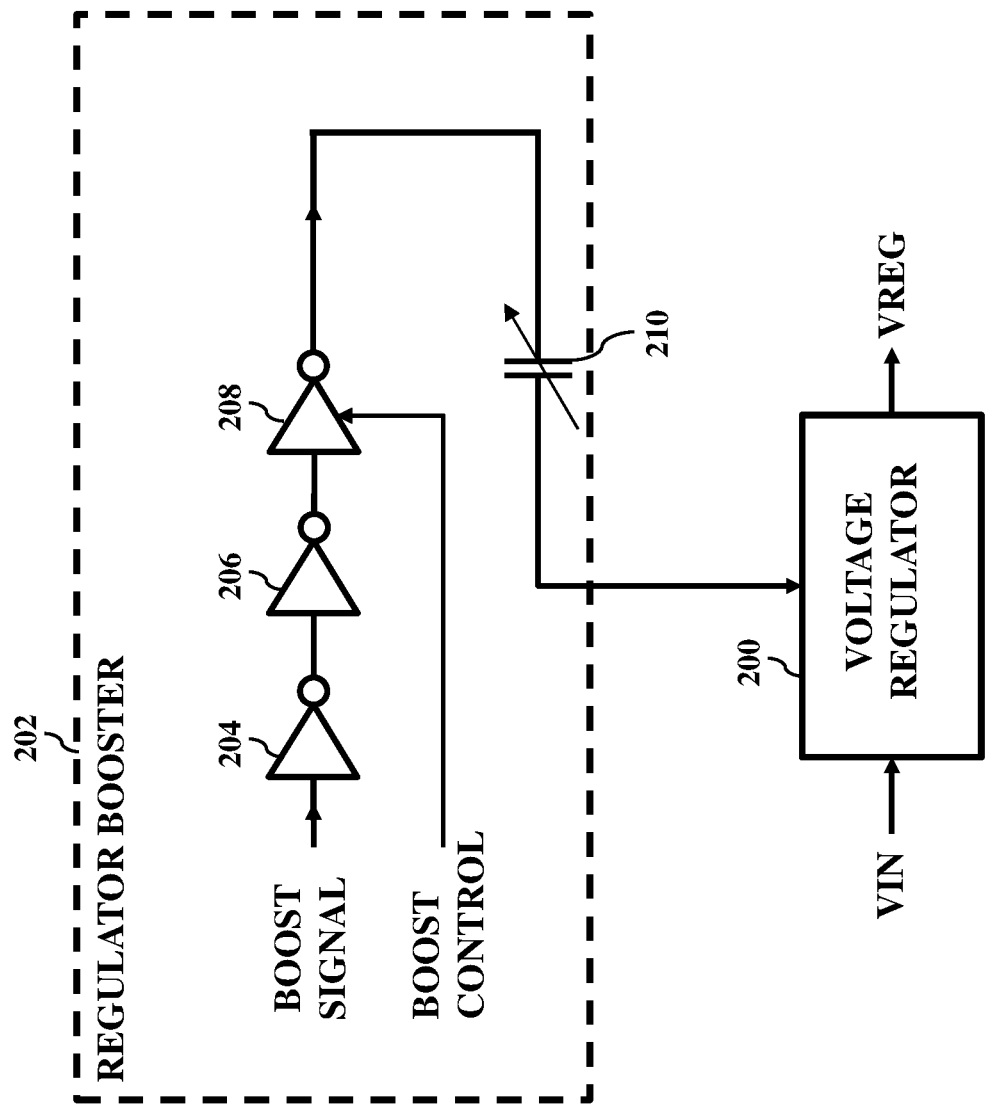
FIG. 4 is a block diagram of an example voltage regulator and example regulator booster according to an embodiment.

As shown in FIG. 4, a voltage regulator 200 of memory module 20 receives a voltage input VIN and generates a regulated output voltage VREG. In some embodiments, voltage regulator 200 comprises a VRM within one of data buffers 30. In other embodiments, voltage regulator 200 may comprise any of VRMs 102-116. In yet other embodiments, voltage regulator 200 may comprise any other VRM of memory module 20.

FIG. 4 further illustrates an example regulator booster 202 according to some embodiments. Regulator booster 202 is configured to reduce the voltage droop caused by large changes in the current load on voltage regulator 200, for example, during a read or write transaction.

Regulator booster 202 comprises an inverter 204, an inverter 206, a variable strength T-inverter 208 and a differentiating capacitor 210 connected in series. The output of capacitor 210 connected to voltage regulator 200. Regulator booster 202 receives a boost control signal and a boost signal as inputs.

The strength of T-inverter 208 is controlled by the boost control signal. For example, in one embodiment, RCD 50 transmits a command to a data buffer 30 of memory module 20 that indicates to data buffer 30 when a read or write will occur. In some embodiments, a digital state machine is implemented with register transfer level (RTL) within data buffer 30. The digital state machine receives the command from RCD 50 and the RTL issues the boost control signal according to the received instruction, e.g., aligned with respect the read or write of the data to or form the data buffer 30. In some embodiments, the boost control signal is an n-bit boost amplitude control signal. Since the edge rate of T-inverter 208 output is much faster than the loop response of voltage regulator 200, the drive strength of T-inverter 208 has little to no impact on the boost. Instead, the boost amplitude is controlled by the amount of charge that is deposited by differentiating capacitor 210 (prop-to-C).

Figure 5:
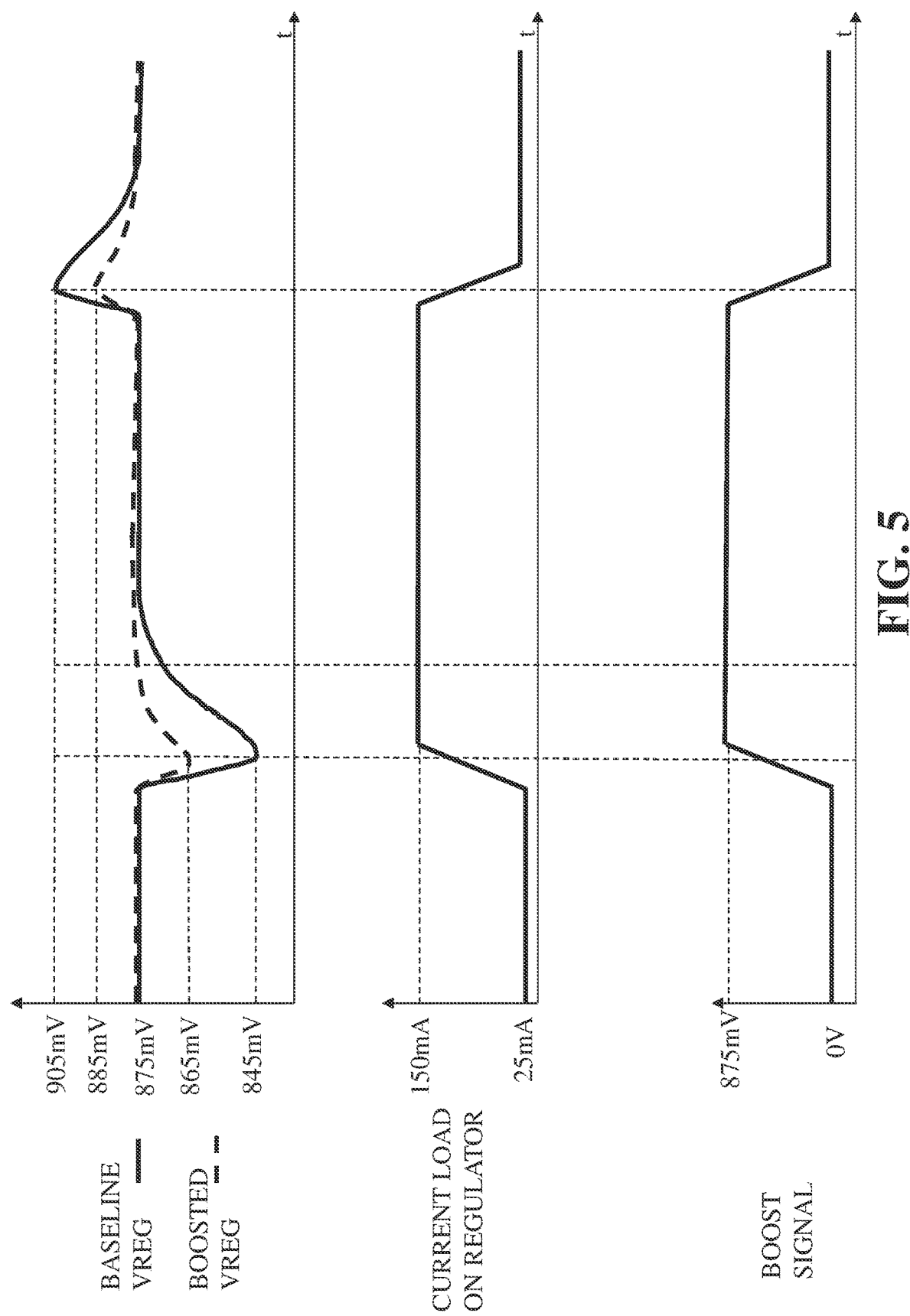
FIG. 5 is an example graph of a comparison between baseline regulated voltage and boosted regulated voltage output by the voltage regulator of FIG. 4 when a boost signal and current load are aligned according to an embodiment.

The RTL also issues the boost signal according to the received command, e.g., aligned with respect the read or write of the data to or from data buffer 30. The boost signal is a square pulse, for example, as seen in FIG. 5. This square pulse is converted to an impulse by differentiating capacitor 210. The impulse is applied to voltage regulator 200 and coupled to VREG simultaneously with a current load spike on voltage regulator 200, e.g., as seen in FIG. 5. Applying the impulse from differentiating capacitor 210 to voltage regulator 200 results in an artificial overshoot at VREG. If timed correctly, the overshoot compensates for the voltage droop created by the high current load, for example, as seen in FIG. 5.

With reference now to FIG. 5, an example scenario is illustrated to highlight the difference between a boosted and baseline voltage regulator behavior. While particular voltage and current values are provided as examples, any other voltage and current values may alternatively be utilized.

The baseline VREG output voltage (solid line), also referred to herein as the target voltage or the operating point of voltage regulator 200, is about 875 millivolts (mV) in the example scenario. When the current load on voltage regulator 200 increases, e.g., spikes, from 25 milliamps (mA) to 150 mA voltage regulator 200 experiences a voltage droop from 875 mV to 845 mV before stabilizing back at the operating point of 875 mV. When the current load on voltage regulator 200 returns from 150 mA back to 25 mA, voltage regulator 200 experiences a voltage spike from 875 mV to 905 mV before stabilizing back to the operating point of 875 mV.

In illustrative embodiments, the magnitude of the voltage droop on the leading edge of the current load spike and the magnitude of the voltage spike on the trailing end of the current load spike may be reduced through the use of regulator booster 202. For example, as shown in FIG. 5, when voltage regulator 200 is boosted by regulator booster 202 (the dashed line), a boost signal (FIG. 5) is provided to regulator booster 202 simultaneously with the increase in the current load (FIG. 5). The boost signal activates regulator booster 202 to apply an impulse from differentiating capacitor 210 to voltage regulator 200 to cause an artificial overshoot of voltage regulator 200, e.g., to increase the VREG output of voltage regulator 200. However, since the impulse is applied simultaneously with the increase in the current load, the artificial overshoot caused by the impulse at least partially balances out the voltage droop caused by the current load spike. For example, as seen in FIG. 5, the boosted VREG at the leading edge of the current load spike drops to 865 mV instead of the 845 mV of the baseline VREG, a significant reduction in the magnitude of the droop.

As seen in FIG. 5, the boost signal is also de-activated simultaneously with the trailing edge of the current load spike, e.g., when the current load spike is removed, such that the impulse output by the of regulator booster 202 is also removed. Removal of the impulse causes the VREG output by voltage regulator 200 to have an artificial undershoot, e.g., a voltage drop. However, the removal of the current load spike on the VREG output of voltage regulator 200 also causes a spike in the voltage of the VREG output. Since both the removal of the impulse and the removal of the current load spike occur simultaneously, the magnitude of the voltage spike caused by removal of the current load spike is mitigated by the artificial undershoot caused by the removal of the impulse, e.g., as seen in FIG. 5. For example, as seen in FIG. 5, the boosted VREG at the trailing edge of the current load spike increases to 885 mV instead of the 905 mV of the baseline VREG, a significant reduction in the magnitude of the increase.

As seen in FIG. 5, the baseline VREG output voltage droop of voltage regulator 200 causes an observable voltage delay or drift at the start of a read or write transaction that may be mitigated through the use of regulator booster 202. By using an appropriate boost signal and boost amplitude the VREG voltage droop due to a current load spike may be reduced by up to, e.g., 50%, 75% or any other amount, and in some cases may be almost entirely mitigated.

For example, the boost signal may be determined based on the timing of the current load spike. The timing of the current load spike may be known in advance where, for example, a command is received by RCD 50 of memory module 20 from memory controller 80 that instructs RCD 50 to wake up one or more components, i.e., loads, of memory module 20 for memory operations. As an example, the command may instruct RCD 50 to wake up one or more of data buffers 30 and initiate a data buffering process which causes the current load spike. Because RCD 50 controls the timing of the data buffering process, e.g., by sending one or more commands to data buffers 30 or other components of memory module 20, RCD 50 may also cause data buffers 30 or other components to provide one or both of the boost control signal and boost signal to their corresponding regulator booster 202, e.g., simultaneously with the current load spike.

In addition, since RCD 50 knows which data buffers 30 or other components are being woken up and will be causing a current load spike on each voltage regulator 200, RCD 50 may also determine the magnitude of the expected voltage drop that will occur on the VREG output of each voltage regulator 200 due to the current load spike. In this case, since the expected voltage drop due to the current load spike is known by RCD 50, the command to the corresponding data buffer 30 or other component may cause the digital state machine RTL of the corresponding data buffer 30 or other component to set the boost amplitude of regulator booster 202 to a value that causes a corresponding overshoot at the VREG output of voltage regulator 200 that has about the same magnitude as the expected voltage drop. By matching the magnitude of the overshoot caused by regulator booster 202 to the magnitude of the expected voltage drop, the effect of the current load spike on the output voltage VREG is mitigated by regulator booster 202.

In some embodiments, a determination and optimization of the boost amplitude may be made at the design implementation phase based on design simulations with the boost values tuned and optimized to best compensate the given type of read or write transaction issued to a particular data buffer 30. In some embodiments, a trimming step during may utilize a peak detection circuit to detect the regulator droop and overshoot magnitude where the magnitude of the boost amplitude may be tuned while monitoring the peak detection circuit's output to achieve the optimal boost value corresponding to the type of read or write transaction being compensated. The optimal value could be programmed into an on-die non-volatile memory component.

Figure 6:
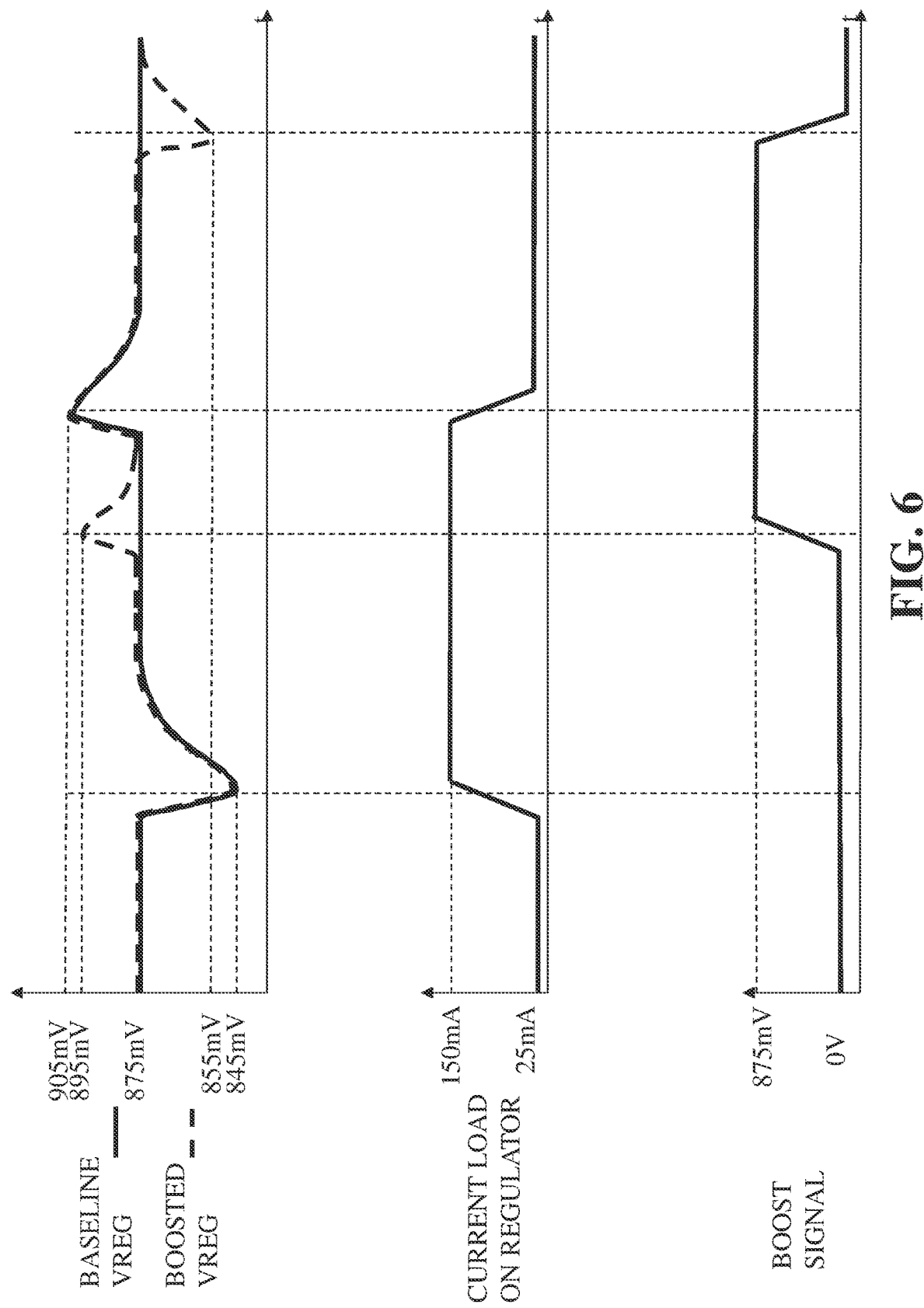
FIG. 6 is an example graph of a comparison between baseline regulated voltage and boosted regulated voltage output by the voltage regulator of FIG. 4 when a boost signal and current load are unaligned according to an embodiment.

It is important to note that in a case where the boost signal is not aligned with the current load spike, additional overshoot or undershoot may occur where the magnitude of these undershoots or overshoots will depend on the booster amplitude setting, for example, as shown in FIG. 6. For example, as seen in FIG. 6, the boost signal is offset from the current load spike. Because of this offset, the boosted VREG voltage drops to 845 mV at the leading edge of the current load spike, stabilizes to 875 mV, spikes to 895 mV at the delayed leading edge of the boost signal, stabilizes again to 875 mV, spikes to 905 mV at the trailing edge of the current load spike, stabilizes back to 875 mV and drops to 855 mV at the trailing edge of the boost signal. Such additional overshoots or undershoots may inhibit the components of memory module 20 that are causing the current load spike from receiving the correct voltage during operation.

The DC operating point of voltage regulator 200 is not affected by the circuitry of regulator booster 202 because differentiating capacitor 210 acts as open circuit for DC current. In this manner, the impact of a control state error may be inhibited. In addition, since there is no current through differentiating capacitor 210, there is no feed forward zero to compensate for in an AC loop of voltage regulator 200 and AC performance of voltage regulator 200 is largely unaffected.

Figure 7:
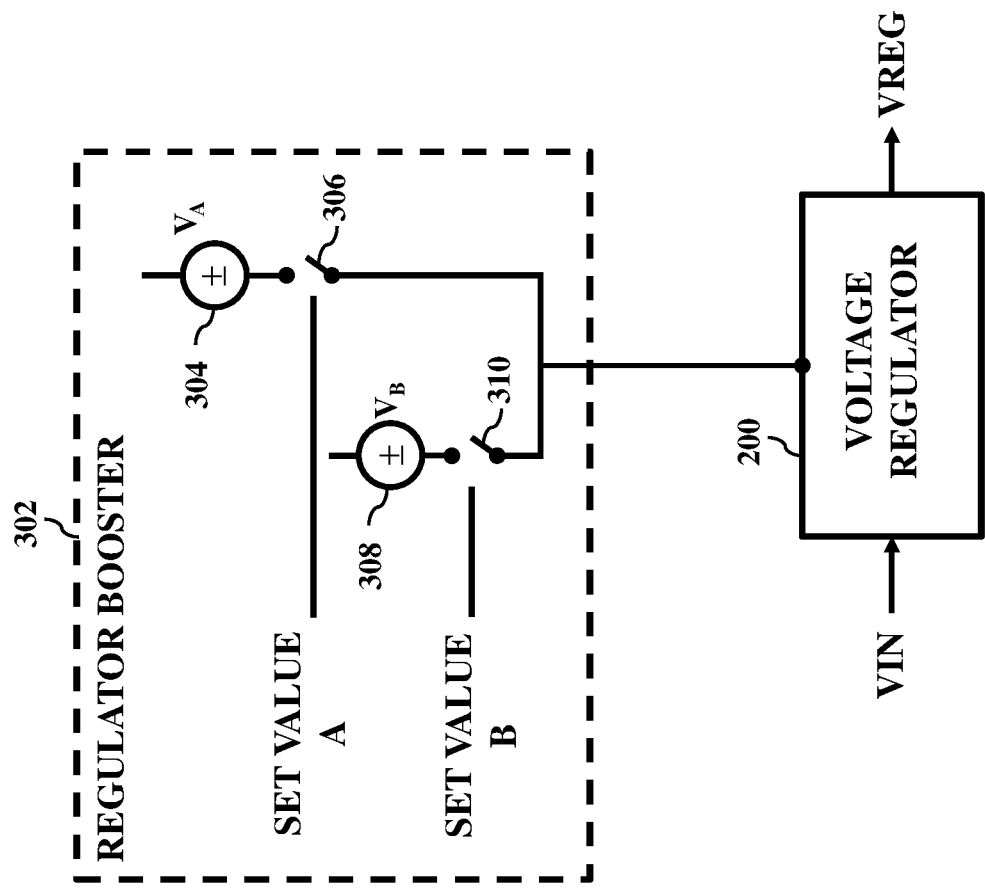
FIG. 7 is a block diagram of an example voltage regulator and example regulator booster according to another embodiment.

FIG. 7 further illustrates another example regulator booster 302 according to some embodiments. Regulator booster 302 is configured to reduce the voltage droop caused by large changes in the current load on voltage regulator 200, for example, during a read or write transaction.

Regulator booster 302 comprises a first voltage source 304, a first switch 306, a second voltage source 308 and a second switch 310. First and second voltage sources 304 and 38 are connected in parallel with an output connected to voltage regulator 200. The respective first and second switches 306 and 308 are used to momentarily drive known voltages from first and second voltage sources 304 and 308, either individually or combined, on voltage regulator 200 and to quickly release first and second voltage sources 304 and 308 after the desired voltage has been applied. As an example, first voltage source 304 may have a voltage of $V_A$ and the corresponding first switch 306 may be activated and then deactivated by a set value A signal to momentarily drive the voltage $V_A$ on voltage regulator 200. As another example, second voltage source 308 may have a voltage of $V_B$ and the corresponding second switch 310 may be activated and then deactivated by a set value B signal to momentarily drive the voltage $V_B$ on voltage regulator 200. In another example, both set value A and set value B may be activated together to drive a combination of voltage $V_A$ and voltage $V_B$ on the voltage regulator. Set value A and set value B signals may be issued by the RTL of the digital state machine of the corresponding data buffer 30 or other component of memory module 20, e.g., according to a command received from RCD 50.

Figure 8:
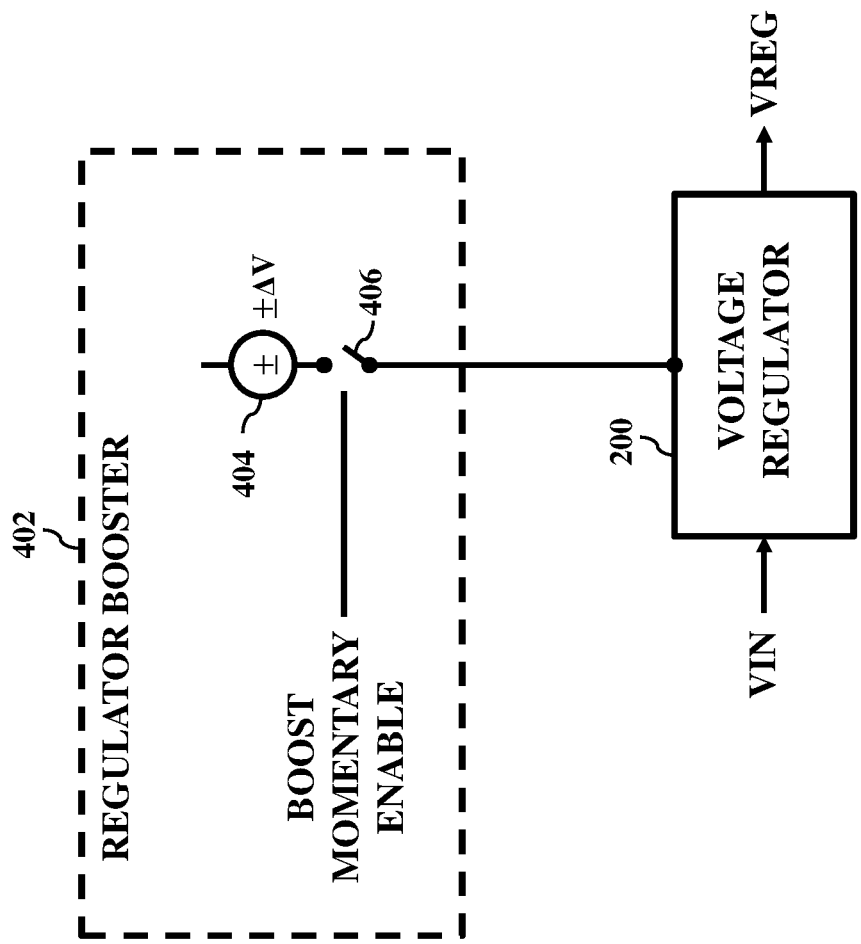
FIG. 8 is a block diagram of an example voltage regulator and example regulator booster according to another embodiment.

FIG. 8 further illustrates another example regulator booster 402 according to some embodiments. Regulator booster 402 is configured to reduce the voltage droop caused by large changes in the current load on voltage regulator 200, for example, during a Read/Write transaction.

Regulator booster 402 comprises a voltage source 404 and a switch 406. Voltage source 404 is a variable voltage source that may be set to a target or desired voltage value $\pm\Delta V$. The output of the voltage source 404 is serially connected with voltage regulator 200 via switch 406. Switch 406 is used to momentarily drive the voltage of voltage source 404 on voltage regulator 200 and to quickly release voltage source 404 after the desired voltage has been applied. As an example, voltage source 404 may have a variable voltage ±ΔV that is set to the desired voltage. Switch 406 is activated and then deactivated by a boost momentary enable signal to momentarily drive the desired voltage on voltage regulator 200. In some embodiments, the value of voltage source 404 may be determined prior to each activation of switch 406 or may be set at any other time. In some embodiments, the value of voltage source 404 may be pre-determined and may not be changed during operation. The boost momentary enable signal may be issued by the RTL of the digital state machine of the corresponding data buffer 30 or other component of memory module 20, e.g., according to a command received from RCD 50.

While in illustrative embodiments, voltage regulator 200 and regulator boosters 202, 304 and 402 are described as being utilized in a memory module 20 such as, e.g., a DDR memory module, or as being part of data buffers 30 or a PMIC 60 of such a memory module 20, in other embodiments regulator boosters 202, 302 and 402 may be utilized with a voltage regulator 200 of any other device or system in which voltage regulation is utilized.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The disclosed embodiments of the present invention have been presented for purposes of illustration and description but are not intended to be exhaustive or limited to the invention in the forms disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

The invention claimed is:

1. An apparatus comprising:
a voltage regulator supplied by an input and configured to generate a regulated output, the regulated output having a voltage corresponding to an operating point of the voltage regulator; and
a regulator booster connected to the voltage regulator that, when activated, is configured to boost the voltage of the regulated output by a target amount, the target amount being at least a portion of a magnitude of a voltage droop relative to the operating point that is caused by a change in a current load on the regulated output,
wherein the regulator booster is configured to be activated by a boost signal sent from a clock driver, and
wherein the regulator booster comprises a plurality of voltage sources, each voltage source of the plurality of voltage sources having a corresponding switch, the switch corresponding to each of the plurality of voltage sources being configured to temporarily couple that voltage source to the voltage regulator, the voltage of each voltage source being configured to boost the voltage of the regulated output by at least a portion of the target amount.

2. The apparatus of claim 1, wherein the regulator booster comprises a plurality of inverters.

3. The apparatus of claim 2, wherein at least one of the plurality of inverters is a variable-strength inverter.

4. The apparatus of claim 3, wherein the variable-strength inverter is controlled by a boost control signal, the boost control signal being configured to control an amplitude of the boost of the voltage by the regulator booster.

5. The apparatus of claim 2, wherein the regulator booster comprises a capacitor.

6. The apparatus of claim 5, wherein:
a first inverter of the plurality of inverters is fed by the boost signal;
the capacitor is configured to generate an impulse on the voltage regulator based at least in part on the boost signal; and
the impulse is configured to boost the voltage of the regulated output by the target amount.

7. The apparatus of claim 1, wherein the boost signal is a square wave.

8. The apparatus of claim 5, wherein the capacitor is a differentiating capacitor.

9. The apparatus of claim 5, wherein the plurality of inverters and the capacitor are connected in series.

10. The apparatus of claim 1, wherein the regulator booster comprises a voltage source and a switch, the switch being configured to temporarily couple the voltage source to the voltage regulator, the voltage of the voltage source being configured to boost the voltage of the regulated output by the target amount.

11. The apparatus of claim 10, wherein the voltage source comprises a variable voltage source, the variable voltage source being tunable to boost the voltage of the regulated output by the target amount.

12. A memory module comprising:
a data buffer comprising:
a voltage regulator supplied by an input and configured to generate a regulated output, the regulated output having a voltage corresponding to an operating point of the voltage regulator; and
a regulator booster connected to the voltage regulator that, when activated, is configured to boost the voltage of the regulated output by a target amount, the target amount being at least a portion of a magnitude of a voltage droop relative to the operating point that is caused by a change in a current load on the regulated output; and
a clock driver configured to:
receive an instruction to activate a load corresponding to the voltage regulator; and
send a boost signal to the data buffer to activate the regulator booster in conjunction with sending a command to the load to activate the load based at least in part on the received instruction.

13. The memory module of claim 12, wherein:
the regulator booster comprises a plurality of inverters and a capacitor;
a first inverter of the plurality of inverters is fed by a boost signal;
the capacitor is configured to generate an impulse on the voltage regulator based at least in part on the boost signal; and
the impulse is configured to boost the voltage of the regulated output by the target amount.

14. An apparatus comprising:
a regulator booster configured to:
be activated by a boost signal sent from a clock driver, wherein the boost signal is sent from the clock driver in conjunction with the clock driver sending a command to a load to activate the load, based at least in part on an instruction received by the clock driver to activate the load; and
when activated by the boost signal, boost a voltage of a regulated output by a target amount, the target amount being at least a portion of a magnitude of a voltage droop relative to an operating point of the regulated output that is caused by a change in a current load on the regulated output.

15. The apparatus of claim 14, wherein:
the regulator booster comprises a plurality of inverters and a capacitor;
a first inverter of the plurality of inverters is fed by the boost signal;
the capacitor is configured to generate an impulse on the regulated output based at least in part on the boost signal; and
the impulse is configured to boost the voltage of the regulated output by the target amount.

16. The apparatus of claim 15, wherein:
at least one of the plurality of inverters is a variable-strength inverter; and
the variable-strength inverter is controlled by a boost control signal, the boost control signal being configured to control an amplitude of the boost of the voltage by the regulator booster.

17. The apparatus of claim 15, wherein the capacitor is a differentiating capacitor.

* * * * *